US00RE43023E

(19) United States
(12) Reissued Patent
Nakashima et al.

(10) Patent Number: US RE43,023 E
(45) Date of Reissued Patent: Dec. 13, 2011

(54) DUAL LOADING PORT SEMICONDUCTOR PROCESSING EQUIPMENT

(75) Inventors: Takanobu Nakashima, Tokyo (JP); Tatsuhisa Matsunaga, Tokyo (JP); Hidehiro Yanagawa, Tokyo (JP)

(73) Assignee: Hitachi Kokusai Electric Inc., Tokyo (JP)

(21) Appl. No.: 12/724,026

(22) Filed: Mar. 15, 2010

Related U.S. Patent Documents

Reissue of:
(64) Patent No.: 6,641,350
Issued: Nov. 4, 2003
Appl. No.: 09/834,913
Filed: Apr. 16, 2001

(30) Foreign Application Priority Data

Apr. 17, 2000 (JP) ..... 2000-114818

(51) Int. Cl.
*F26B 21/06* (2006.01)
(52) U.S. Cl. ..... 414/217; 414/940; 414/810
(58) Field of Classification Search ..... 414/217, 414/411, 939, 810
See application file for complete search history.

(56) References Cited

U.S. PATENT DOCUMENTS

| | | | | |
|---|---|---|---|---|
| 5,239,182 | A | 8/1993 | Tateyama et al. | 250/651 |
| 5,308,993 | A | 5/1994 | Holman et al. | 250/223 R |
| 5,319,216 | A | 6/1994 | Mokuo et al. | 250/559.09 |
| 5,407,181 | A | 4/1995 | Ohsawa | |
| 5,609,459 | A | 3/1997 | Muka | 414/217.1 |
| 5,772,386 | A | 6/1998 | Mages et al. | 414/331.18 |
| 6,042,324 | A | 3/2000 | Aggarwal et al. | 414/217 |
| 6,050,891 | A | 4/2000 | Nering | 414/939 |
| 6,057,662 | A | 5/2000 | McAndrew et al. | 318/567 |
| 6,071,059 | A | 6/2000 | Mages et al. | |
| 6,074,154 | A | 6/2000 | Ueda et al. | |
| 6,142,722 | A | 11/2000 | Genov et al. | 414/217 |
| 6,247,245 | B1 | 6/2001 | Ishii | 34/210 |
| 6,375,403 | B1 | 4/2002 | Mages et al. | |
| 6,425,722 | B1 | 7/2002 | Ueda et al. | |
| 6,461,094 | B1 | 10/2002 | Mages et al. | |
| 6,481,945 | B1 | 11/2002 | Hasper et al. | |
| 6,609,876 | B2 | 8/2003 | Mages et al. | |

FOREIGN PATENT DOCUMENTS

| | | |
|---|---|---|
| JP | 10-125763 | 5/1998 |
| JP | 11-214483 | 8/1998 |
| JP | 10-256346 | 9/1998 |
| JP | 11-31729 | 2/1999 |
| JP | 11-204617 | 7/1999 |
| JP | 11-251392 | 9/1999 |
| JP | 11-251421 | 9/1999 |
| JP | 11-345854 | 12/1999 |

(Continued)

OTHER PUBLICATIONS

Korean Office Action, dated Nov. 30, 2005, issued in Korea Patent Application No. 10-2001-0020422 with English language translation.

(Continued)

*Primary Examiner* — Charles A Fox
(74) *Attorney, Agent, or Firm* — Brundidge & Stanger, P.C.

(57) ABSTRACT

A substrate processing equipment comprises two pod supporting stages and two independently operable pod door openers. Each pod supporting stage is capable of placing thereon a pod for containing substrates therein. Each pod door openers having means for permitting access to the substrates inside the pod placed on a corresponding pod supporting stage.

20 Claims, 8 Drawing Sheets

FOREIGN PATENT DOCUMENTS

| | | |
|---|---|---|
| JP | 11-354602 | 12/1999 |
| JP | 2000-12670 | 1/2000 |
| JP | 2000-150400 | 5/2000 |
| KR | 1998-080191 | 11/1998 |

OTHER PUBLICATIONS

Taiwanese Office Action, dated May 17, 2002, issued in Taiwanese Patent Application No. 90109146 with English language translation.

Japanese Office Action, dated Dec. 18, 2008, issued in Japanese Patent Application No. 2001-115619 with English language translation.

Japanese Office Action, dated Apr. 8, 2009, issued in Japanese Patent Application No. 2001-115619 with English language translation.

DUAL LOADING PORT SEMICONDUCTOR PROCESSING EQUIPMENT

Matter enclosed in heavy brackets [ ] appears in the original patent but forms no part of this reissue specification; matter printed in italics indicates the additions made by reissue.

*CROSS-REFERENCES TO RELATED APPLICATIONS*

*The present application claims priority from Japanese Patent Application No. 2000-114818, filed Apr. 17, 2000, and is a reissue application of U.S. Pat. No. 6,641,350, issued Nov. 4, 2003, the contents of which are incorporated herein by reference. More than one reissue application has been filed for the reissue of U.S. Pat. No. 6,641,350. The reissue applications are application Ser. No. 12/724,026 (the present application), and application Ser. Nos. 12/724,613 and 12/724,625, both filed Mar. 16, 2010, and both of which are continuation reissue applications of the present application, and both of which are now abandoned.*

FIELD OF THE INVENTION

The present invention relates to a semiconductor processing equipment; and, more particularly, to a device for moving doors of substrate carriers, e.g., for use in a semiconductor processing equipment such as a batch-type vertical apparatus for performing a diffusion or a CVD (chemical vapor deposition) process to form diffusion, dielectric or metallic layers on semiconductor wafers.

BACKGROUND OF THE INVENTION

In a semiconductor processing equipment such as a batch-type vertical apparatus for performing a diffusion or a CVD process, semiconductor wafers are loaded into and unloaded from the apparatus while being kept in cassettes. Two kinds of carriers have been conventionally used. One is a box-shaped cassette having a pair of openings on two opposite sides and the other is a box-shaped FOUP (front opening unified pod; hereinafter, pod) having an opening on one side thereof with a pod door removably mounted thereon.

In the semiconductor processing equipment using the pod as the carrier, the wafers can be kept protected from contaminations of ambient atmosphere while being transferred since the pod containing the wafers is airtightly closed. Accordingly, the degree of cleanliness required for a clean room of the semiconductor processing equipment may be lowered, which in turn reduces cost for the maintenance of the clean room. For such reasons, the pod is gaining popularity as the carrier in the semiconductor processing equipment recently.

The semiconductor processing equipment using the pod as the wafer carrier is provided with a pod door opener for remaining and restoring the pod door. One example of such conventional pod door opener is disclosed in U.S. Pat. No. 5,772,386, wherein the pod door opener is disposed on a wafer loading port and equipped with a closure capable of frictionally engaging with a door of the pod located on the wafer loading port. The pod can be uncovered by lowering down the closure while the closure engages with the door.

However, since the conventional semiconductor processing equipment is provided with only a single wafer loading port, the lead time required in preparing wafers for an actual process increases due to replacement of a pod on the wafer loading port with another, which in turn lengthens the overall processing time of the semiconductor manufacturing process, thereby reducing the throughput thereof.

Another equipment having a multi-stage pod door system is disclosed in U.S. Pat. No. 6,042,324. Since, however, the pod doors of the equipment are simultaneously opened as a single unit by a vertical actuator, the lead time may not be reduced and the height of the equipment increases.

SUMMARY OF THE INVENTION

It is, therefore, a primary object of the present invention to provide a semiconductor processing equipment capable of increasing the throughput thereof.

In accordance with one aspect of the present invention, there is provided a semiconductor processing equipment comprising:

- a plurality of wafer loading ports for seating carriers containing a number of wafers, the wafer loading ports being vertically stacked; and
- a same number of carrier door openers as the wafer loading ports for opening doors of the carriers while the carriers are disposed respectively on the wafer loading ports, the pod door openers being operated independently of each other,
- wherein, while one carrier on one of the wafer loading ports is under wafer loading or unloading process, other carriers are prepared for the wafer loading or unloading process on other wafer loading ports.

In accordance with another aspect of the present invention, there is provided a method for processing wafers for use in a method for processing substrates for use in a semiconductor processing equipment having at least two loading ports, a plurality of carriers each of which contains a portion of the substrates, a carrier shelf for storing the carriers, a reaction chamber and a boat for loading and unloading the substrates into and out of the reaction chamber, the method comprising the step of transferring the substrates between the carriers and the boat, wherein the transferring step includes the steps of:

- conveying one carrier between the carrier shelf and one loading port; and
- carrying the portion of the substrates contained in the carrier between the carrier and the boat,
- wherein, while the carrier on the loading port is under the transferring step, another carrier is transferred between the carrier shelf and another loading port.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

A preferred embodiment of the present invention will now be described with reference to the accompanying drawings.

Figure 1:
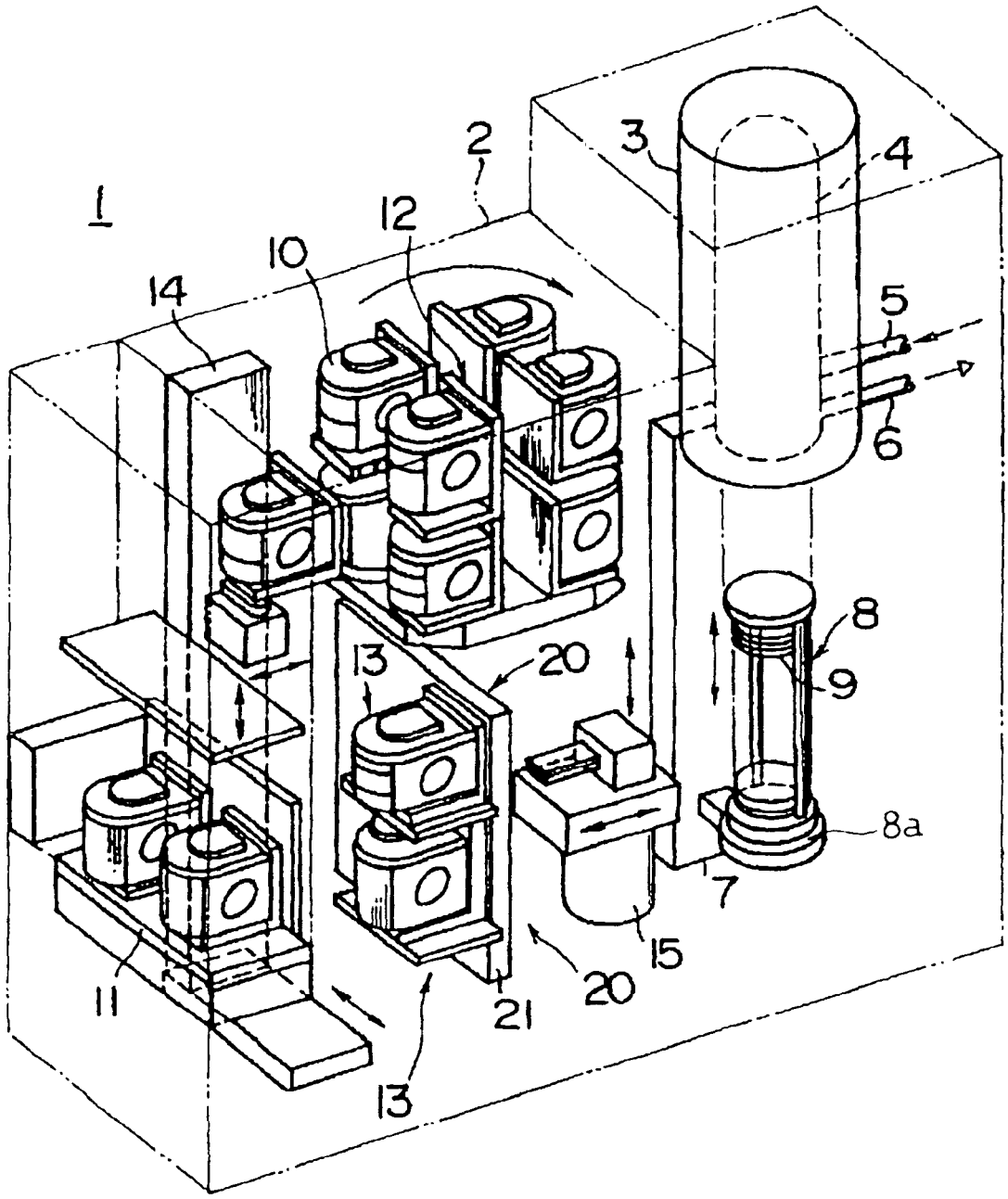
FIG. 1 schematically shows a semiconductor processing equipment in accordance with the present invention.

FIG. 1 shows a semiconductor processing equipment 1 having a batch-type vertical apparatus for performing, e.g., a diffusion or a CVD process. The semiconductor processing equipment 1 is provided with an airtightly sealed housing 2. At an upper portion of the rear side of the housing 2, a heater unit 3 is vertically installed and a process tube 4 is concentrically disposed within the heater unit 3. The process tube 4 has a gas supply line 5 for supplying a process gas or a purge gas into the process tube 4, and an exhaust line 6 for use in evacuating the process tube 4. A boat elevator 7 is installed below the process tube 4 to move a boat 8 having a boat receptacle 8a up and down, thereby loading or unloading the boat 8 into or from the process tube 4. A plurality of wafers 9 can be loaded in the boat 8 in such a manner that the centers of the wafers are vertically aligned while maintaining a predetermined distance between two neighboring wafers.

Formed on a front wall of the housing 2 is a pod load/unload opening (not shown) through which pods 10 can be loaded into or unloaded from the housing 2. The pod load/unload opening can be open and closed by a shutter (not shown). In front of the pod load/unload opening, a pod stage 11 is provided for receiving multiple, e.g., two, pods at a time.

At the upper central portion of the semiconductor processing equipment 1, a rotatable pod shelf 12 is arranged. The pod shelf 12 is capable of holding, e.g., eight pods 10. The numbers of pods that the pod shelf 12 can support is not limited to eight but may be increased, e.g., up to sixteen. The pod shelf 12 has two vertically disposed swastika-shaped pod supporting plates, each being capable of holding, e.g., 4 pods simultaneously. The pod shelf 12 is uni-directionally rotatable in a horizontal plane on a pitch-by-pitch basis by a rotary actuator (not shown), e.g., a stepping motor.

Below the pod shelf 12, there is provided a two pod openers 20 each of which includes a wafer loading port 13, bulkhead 21 and a closure 40. The wafer loading ports 13 through which the wafers are carried into or out of the pod 10 are vertically stacked.

Inside the housing 2, a pod handler 14 is installed between the pod stage 11 and the pod shelf 12. The pod handler 14 is adapted to transfer pods between the pod shelf 12 and the wafer loading ports 13 and between the pod shelf 12 and the pod stage 11. Pod transfer may also be conducted between the pod stage 11 and the wafer loading ports 13, if necessary. Moreover, a wafer carry assembly 15 is provided between the boat 8 and the wafer loading ports 13 to transfer wafers 9 therebetween.

Details of the pod opener 20 will now be described with reference to FIGS. 1 to 6B.

Figure 2:
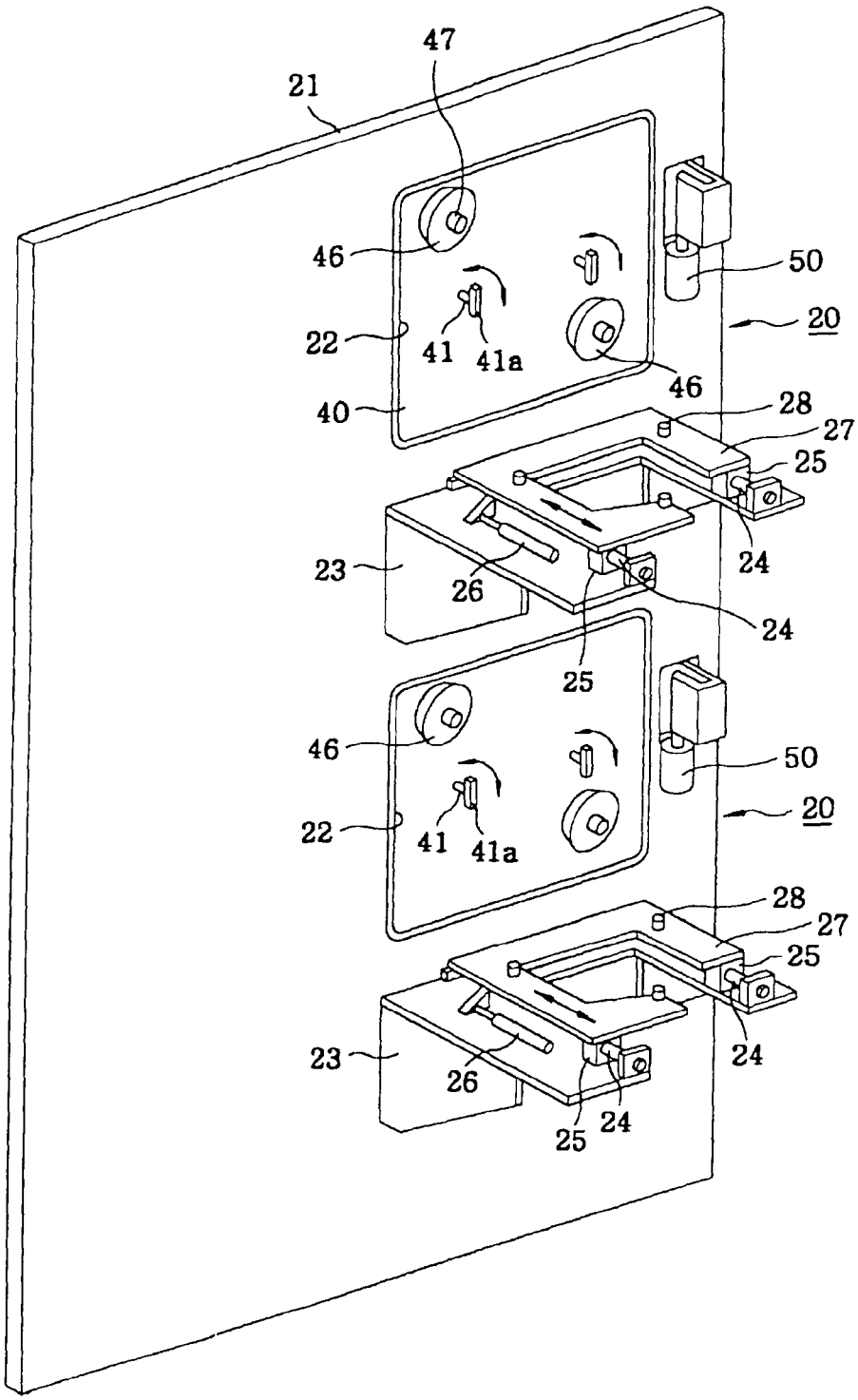
FIG. 2 illustrates a perspective front view of a pod door opener.
Figure 3:
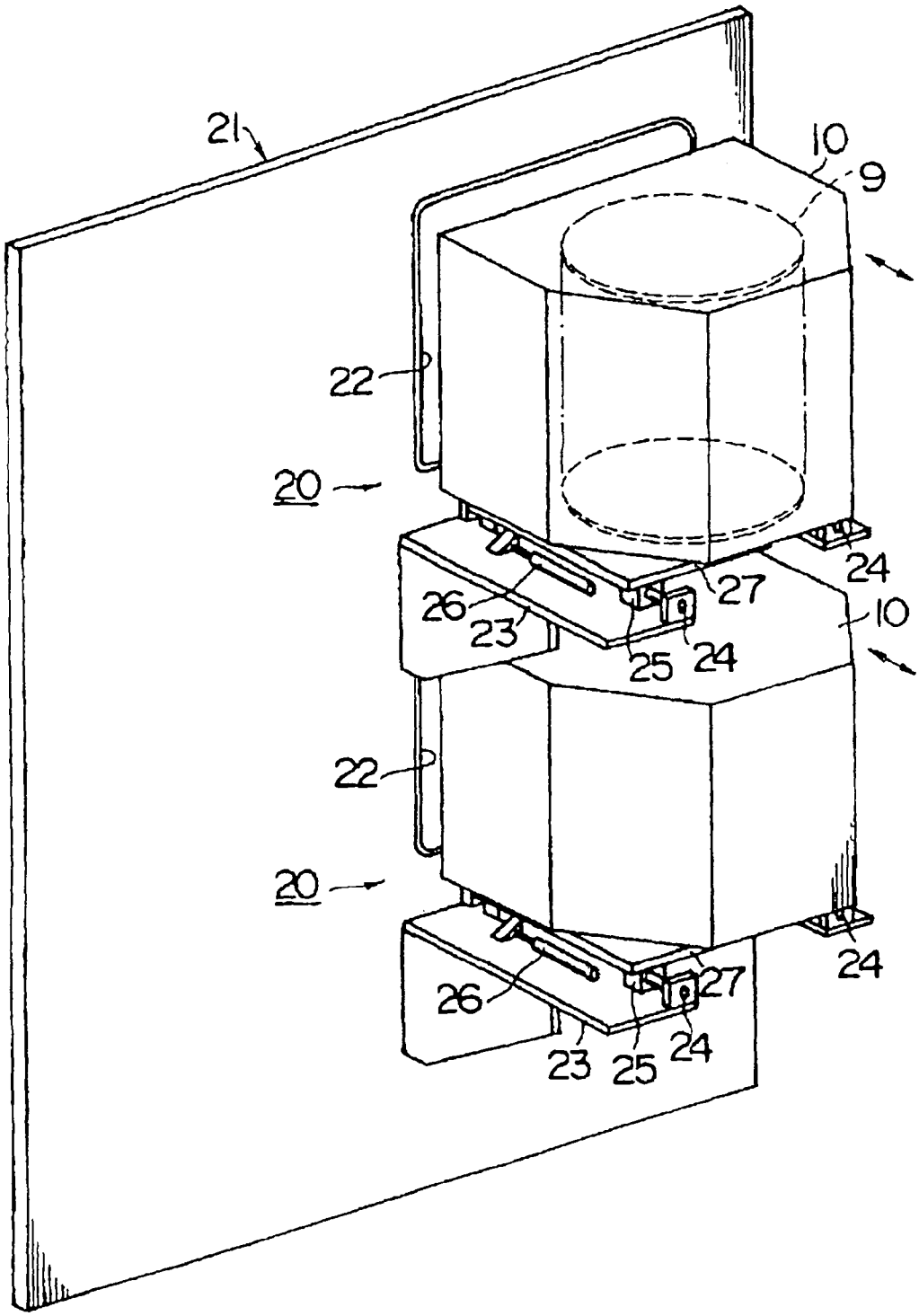
FIG. 3 is a perspective view of the pod door opener with pods disposed on the wafer loading ports.
Figure 6A:
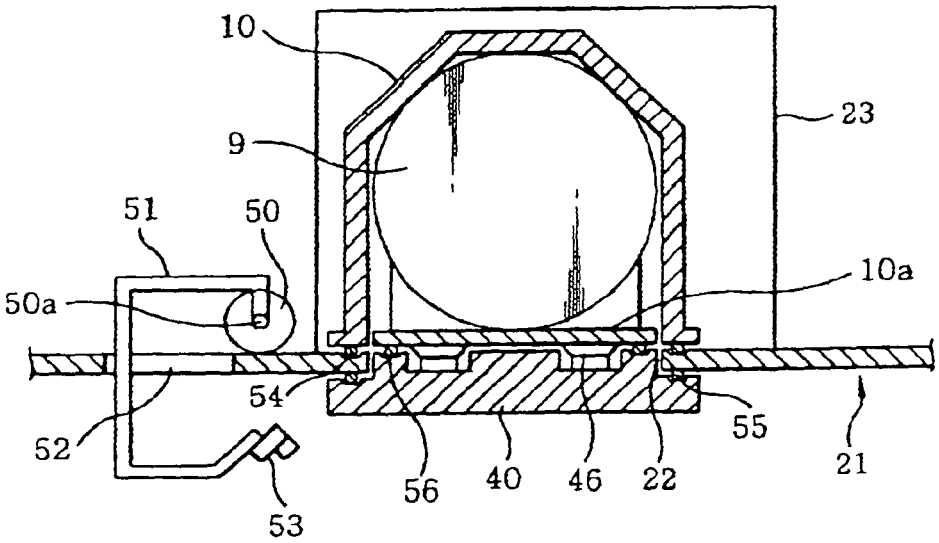
FIG. 6A shows a plan view of a mechanism for mapping with the arm retracted.
Figure 6B:
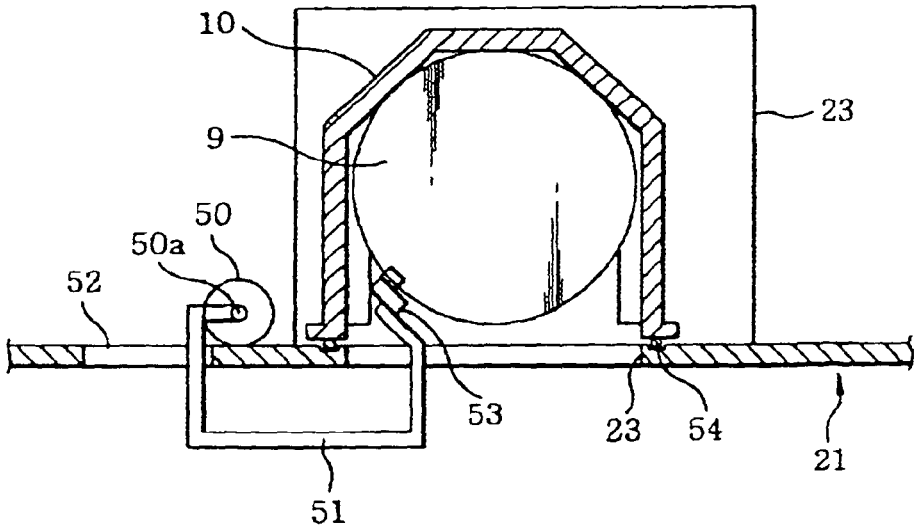
FIG. 6B shows a plan view of a mechanism for mapping with the arm in operation position.

As shown in FIG. 1, the semiconductor processing equipment in accordance with the present invention includes a vertically oriented bulkhead 21 which is used by both of the pod openers 20 in common. The wafer loading ports 13 are vertically provided on the front surface of the bulkhead 21 facing the pod stage 11 and the corresponding closures 40 are provided on the rear surface of the bulkhead 21 facing the wafer carry assembly 15 as shown in FIGS. 2 and 3. The bulkhead 21 has rectangular-shaped openings 22 through which pod doors 10a are coupled with the corresponding door openers 20. The size of an opening 22 is larger than that of the pod door 10a, which also has a rectangular shape, as shown in FIGS. 6A and 6B. The rectangular-shaped openings 22 are vertically provided in the bulkhead 21.

As shown in FIG. 2, a support 23 for each of the wafer loading ports 13 is horizontally provided on the front surface of the bulkhead 21 below each opening 22. The plan view of the support 23 is of a substantially square frame shape having some cutout portion at the distal end thereof away from the bulkhead 21. A pair of parallel guide rails 24 are mounted on an upper plate of the support 23, the rails 24 running normal to the front surface of the bulkhead 21. A loading platform 27 is slidably mounted on the guide rails 24 through guide blocks 25. The loading platform 27 can move toward and away from the opening 22, i.e., in a to-and-fro direction, by an air cylinder 26 mounted on the upper plate of the support 23.

The loading platform 27 also has a substantially square frame shape with some cutout portion at the distal end thereof away from the bulkhead 21. On the upper surface of the loading platform 27, vertically oriented alignment pins 28 provided at locations corresponding to, e.g., three corner points of an equilateral triangle. These pins are adapted to match with corresponding holes (not shown) formed at a bottom surface of the pod 10.

Figure 4:
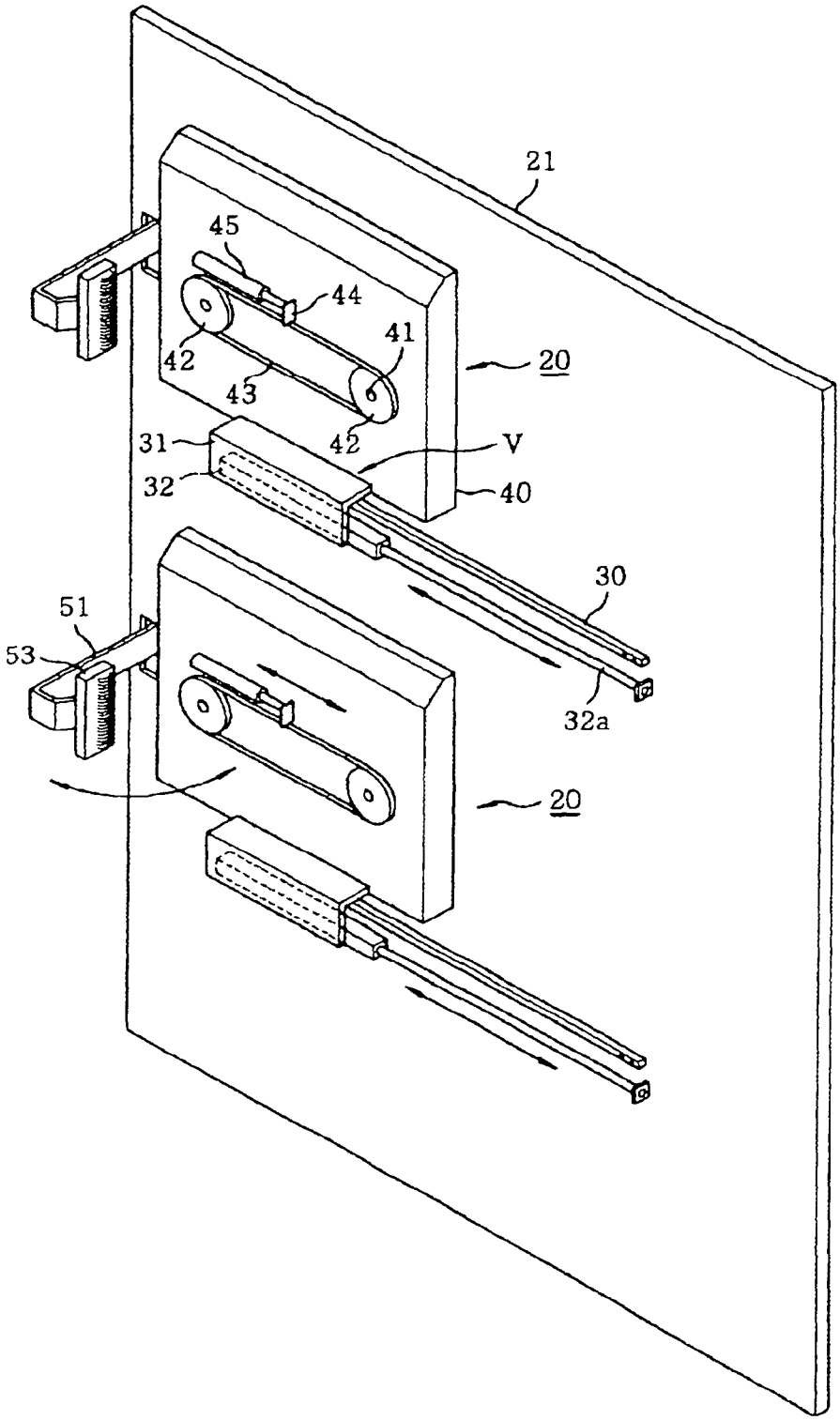
FIG. 4 describes a schematic perspective rear view of the pod door opener with some parts eliminated.

As shown in FIG. 4, a guide rail 30 for each of the pod openers 20 is mounted on the rear surface of the bulkhead 21 below the corresponding opening 22. The guide rail 30 is extended horizontally parallel to the rear surface of the bulkhead 21, i.e., along the left-right direction. An angle-shaped slider 31 is slidably supported by the guide rail 30 and movable in the left-right direction. An air cylinder 32 is mounted on a vertical portion of the angle-shaped slider 31 along the left-right direction. An end portion of a piston rod 32a of the air cylinder 32 is anchored to the bulkhead 21. The movement of the angle-shaped slider 31 is controlled by the retraction and extension of the air cylinder 32.

Figure 5:
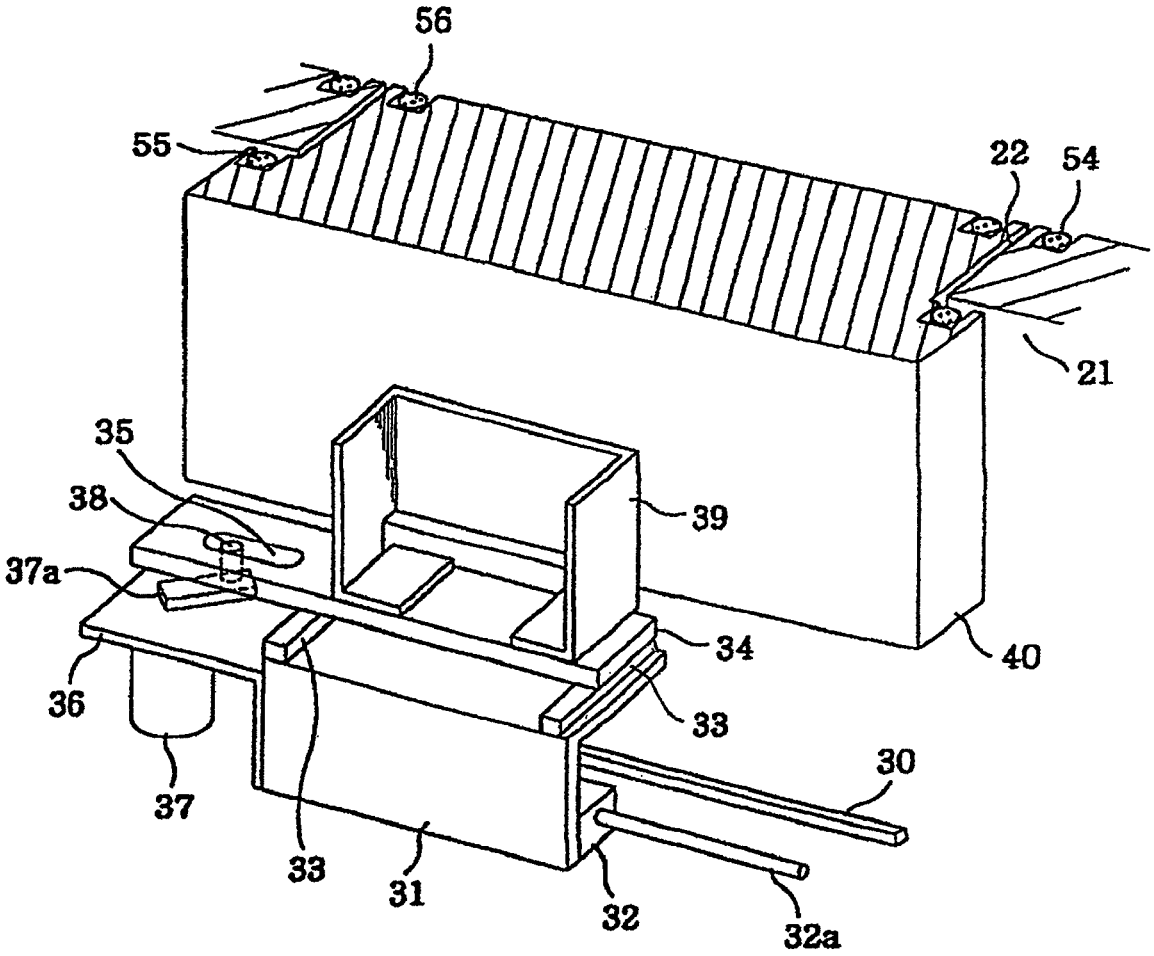
FIG. 5 represents a perspective view of the eliminated parts V in FIG. 4.

As shown in FIG. 5, a pair of parallel guide rails 33 running along the to-and-fro direction are installed on an upper surface of a horizontal portion of the angle-shaped slider 31. A back/forth slider 34 is slidably mounted on the guide rails 33. The back/forth slider 34 has a guide hole 35 which extends in the left-right direction in one end portion along the left-right direction, e.g., a left end portion of the back/forth slider 34. A bracket 36 is fixedly mounted on the left side portion of the angle-shaped slider 31 and a rotary actuator 37 is vertically mounted on the bracket 36. A circularly moving guide pin 38 provided at an arm 37a of the rotary actuator 37 is slidably engaged with the guide hole 35. Therefore, the back/forth slider 34 is driven to move toward and away from the bulkhead 21 linearly along the to-and-fro direction by the rotating movement of the rotary actuator 37.

Mounted on the top surface of the back/forth slider 34 is a bracket 39. A square-shaped closure 40 larger than the opening 22 is vertically fixed to the bracket 39. The square-shaped closure 40 is movable in the to-and-fro direction by the movement of the back/forth slider 34 and in the left-right direction by the movement of the angle-shaped slider 31. The front surface of the closure 40 facing toward the wafer loading ports 13 has a peripheral region and a central region thicker than the peripheral region. That is, the distance from the front surface at the central region (hereinafter, referred to as central front surface) to the rear surface of the closure 40 is greater than that for the front surface at the peripheral region (hereinafter, referred to as peripheral surface) of the closure 40. The size of the central region of the front surface of the closure 40 is slightly smaller than the opening 22, so that the central region can get into the opening 22.

By such configuration, a peripheral front surface of the closure 40 [can] firmly abuts with the periphery of the opening 22 by moving forward the back/forth slider 34 against the bulkhead 21 [and], *thereby closing* the opening 22 [can be closed].

Further, as shown in FIGS. 5 to 6A, a packing member 55, e.g., an O-ring, may be provided around the peripheral surface of the closure 40 in order to air-tightly seal against the rear side wall of the bulkhead 21 around the opening 22 when the closure 40 abuts with the bulkhead 21. Another packing member 56 may be provided on the peripheral region of the central front surface in order to seal against the pod door 10a lodged on the wafer loading port 13 when the closure 40 abuts with the bulkhead 21. The packing member 56 serves to prevent potential contaminants on the door 10a of the pod 10 from entering into the processing area where the wafer carry assembly 15 is located. An additional packing member 54 may also be provided on the region of the front side wall of the bulkhead 21 around the opening 22 in order to seal against the door frame of the pod 10 when the pod 10 is arranged to move against the bulkhead 21.

As shown in FIGS. 2 and 4, a pair of rotatable keys 41 are arranged on the left and the right sides of the central front surface of the closure 40. The keys 41 are located along the horizontal centerline on the central front surface. Each key is coupled with a pulley 42 provided on the rear surface of the closure 40. Both pulleys 42 are connected by a belt 43 which has a connection plate 44. An air cylinder 45 is horizontally mounted above one of the pulleys 42 and a piston rod thereof is connected to the connection plate 44 such that extension and retraction of the air cylinder 45 can produce a reciprocating rotary motion of the pulleys 42, thereby inducing the keys 41 to rotate. In addition, each key 41 includes a coupling member 41a at the end portion thereof for engaging with a locking mechanism (not shown) on the door 10a of the pod 10.

As shown in FIG. 2, a pair of suction elements 46 capable of holding the pod door 10a by vacuum suction are diagonally provided on two corner regions of the central front surface of the closure 40. Each suction element 46 has a suction pipe 47 and the suction pipe 47 is connected with an air exhaust/supply pipe (not shown). End portions of the suction pipes 47 are adapted to match with aligning holes in the pod door 10a. Therefore, the suction pipes also act as supporting members for holding the pod door 10a.

Referring to FIGS. 2, 4, 6A and 6B, on the front side wall of the bulkhead 21, a rotary actuator 50 having a vertically oriented rotary shaft 50a is installed beside the opening 22. A C-shaped arm 51 is provided to pass through an opening 52 in the bulkhead 21. One end of the C-shaped arm 51 is connected to the rotary shaft 50a and a mapping device 53 for detecting the locations of wafers in the pod 10 is installed at the other end. The C-shaped arm 51 can be rotated in a horizontal plane.

In operation, the pods 10 are loaded onto the pod stage 11 through the pod load/unload opening and then transferred by the pod handler 14 to predetermined positions on the pod shelf 12 for temporary storage as shown in FIG. 1.

Figure 7:
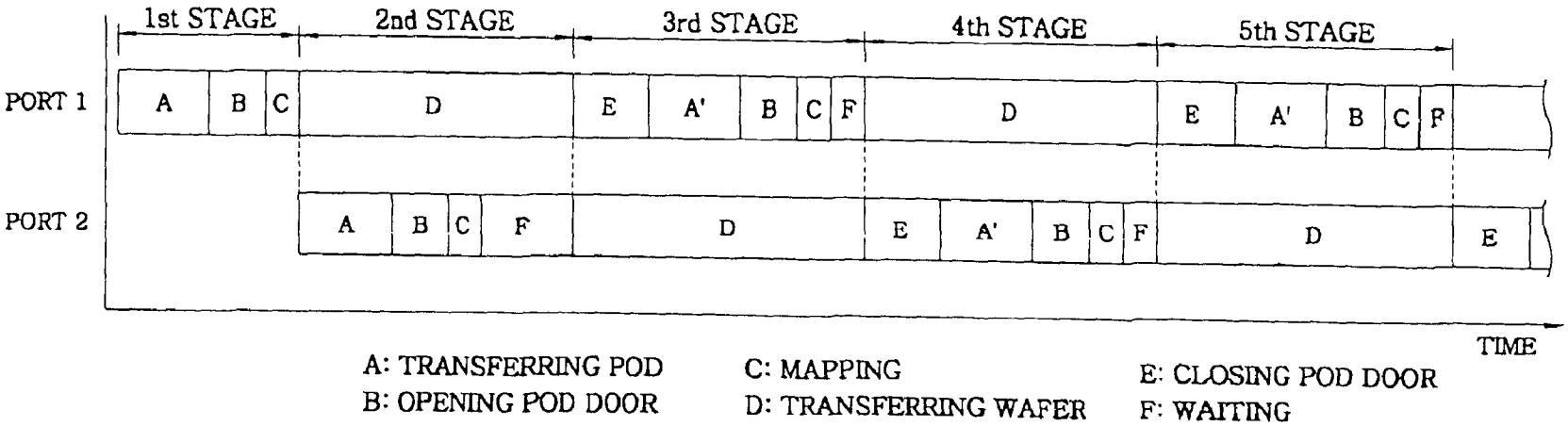
FIG. 7 illustrates a sequence for wafer loading and unloading in accordance with a first preferred embodiment of the present invention.

FIG. 7 illustrates the pod transferring process between the pod shelf 12 and the wafer loading ports 13 and also the wafer transferring process between the pods on the wafer loading ports 13 and the wafer boat 8 in accordance with the first embodiment of the present invention.

The two pod openers 20 are arranged to close the openings 22 such that the packing member 55 seals against the rear side wall of the bulkhead 21. One pod 10 is transferred from the pod shelf 12 to, e.g., the upper wafer loading port 13 by the pod handler 14 and disposed on the loading platform 27. The three alignment pins 28 on the loading platform 27 engage with the corresponding three holes (not shown) formed under the pod 10 to thereby complete the alignment of the pod 10 on the loading platform 27.

The pod 10 provided on the loading platform 27 is moved toward the bulkhead 21 by the extension of the air cylinder 26 in such a manner that the respective packing members 54 and 56 are airtightly in contact with the pod door 10a and the pod frame therearound as shown in FIG. 6A. The keys 41 and the suction pipes 47 of the closure 40 are also inserted in the key holes (not shown) and the aligning holes provided on the door 10a, respectively. The pod transferring process described above is generally represented as a process "A" at the first stage in FIG. 7.

After completing the pod transferring process "A", a negative pressure is applied through the air exhaust/supply pipes 47 inside the suction elements 46 so that the suction elements 46 hold the door 10a by vacuum suction. Thereafter, the keys 41 are rotated by the air cylinder 45 so that the coupling members 41a unlock the door 10a.

Next, the back/forth slider 34 is moved away from the bulkhead 21 by the rotary actuator 37 and then the angle-shaped slider 31 is moved away from the opening 22 by the air cylinder 32 so that the closure 40 holding the pod door 10a by the suction elements 46 is moved to a retreated position. By such movement of the closure 40, the door 10a is separated from the pod 10 and the pod is opened as shown in FIG. 6B, thereby the wafers 9 loaded in the pod 10 is put under a condition that the wafer carry assembly 15 can access thereto. The pod door opening process described above is represented as a process "B" at the first stage in FIG. 7.

Thereafter, as shown in FIG. 6B, the mapping device 53 is moved to the wafers inside the pod 10 through the opening 22 by the rotary actuator 50 and performs mapping by detecting the positions of the wafers, i.e., by identifying slots holding the wafers. After mapping is completed, the mapping apparatus 53 is returned to its initial position by the rotary actuator 50. The mapping process described above is generally represented as a process "C" at the first stage in FIG. 7.

Next, the wafers in the pod 10 on the wafer loading port 13 are transferred to the wafer boat 8 by the wafer transfer assembly 15. The wafer transferring process described above is generally represented as a process "D" [at] *after* the first stage in FIG. 7.

While the wafer transferring process *"D"* is performed [at] *after* the first *stage*, e.g., the upper wafer loading port 13, the pod transferring process "A", the pod door opening process "B" and the mapping process "C" are sequentially carried out at the second *stage*, e.g., the lower wafer loading port 13. [the] *The* second wafer loading port 13 waits (process [E] *"F"*) until the wafer transferring process "D" at the first wafer loading port 13 is completed.

Accordingly, upon the completion of the wafer transferring process "D" of the first wafer loading port 13 [at], *for which* the second stage *is waiting* (*process "F"*), the wafer transferring process "D" can be started at the second wafer loading port 13 as shown in FIG. 7 (third stage). As a result, the wafer transferring operation can be alternatively performed by the wafer loading [port] *ports* 13 without interruption due to the replacement of the pods 10 and thus the system efficiency or the throughput of the semiconductor processing equipment can be improved.

During the third stage shown in FIG. 7, where the wafer transferring process "D" is carried out by the second wafer loading port 13, a pod door closing process "E", a pod changing process "A", the pod door opening process "B", the mapping process "C" and the waiting process "F" are sequentially carried out in that order, so that the wafer transferring process "D" can be started by the first wafer loading port 13 immediately after the completion of the process "D" at the second wafer loading port 13 (*fourth stage*).

The pod door closing process is carried out as follows. The closure 40 holding the pod door 10a is removed from the retreated position toward the opening 22 by the air cylinder 32 and then toward the empty pod 10 by the rotary actuator 37 to close the pod 10 by the pod door 10a thereafter, the keys 41 are rotated by the air cylinder 45 to actuate the locking mechanism of the pod door 10a. After locking, the negative pressure inside the suction element 46 is removed by supplying a positive pressure through the pipe 47 and the closure 40. The closure 40 remains in that position until the pod door opening process "B" is resumed.

The pod changing process "A" is carried out as follows. After the pod door 10a is restored on the empty pod 10 by the pod door closing process "E", the loading platform 27 of the first wafer loading port holding the empty pod is moved away from the bulkhead 21 by the air cylinder 26. The empty pod 10 is then stored back to the pod shelf 12 and a new pod holding wafer therein is transferred to the first wafer loading port. Thereafter, the newly supplied pod is provided to the closure 40 in an identical manner as in the pod transferring process "A". The remaining process "B", "C" and "F" are identical to those of the second stage.

The wafer loading processes are repeated until the described number of wafers are loaded from the pods 10 to the wafer boat 8. After transferring the described number of wafers, the last two empty pods may be removed to the pod shelf 12 or stayed on the wafer loading ports 13. Alternatively, only one empty port 13 may remain at the one wafer loading port 13. The number of wafers which the wafer boat 8 can hold for one batch process is, e.g., 100 to 150, which is several times greater than that of wafers which one pod can contain therein, e.g., 25.

After the predetermined number of unprocessed wafers are loaded on the wafer boat 8, the boat elevator 7 lifts the wafer boat 8 into the process tube 4. When the wafer boat 8 is introduced into the process tube 4, a lower end opening of the process tube 4 is hermetically sealed by the boat receptacle 8a.

Next, the process tube 4 is evacuated through the exhaust pipe 6 to reduce the pressure therein down to a predetermined vacuum level. Thereafter, a desired wafer process, e.g., a diffusion or a CVD process, is carried out on the loaded wafers by controlling temperatures at desired levels by using the heater unit 3 while supplying predetermined process gases into the process tube 4 through the gas supply line 5.

After a predetermined processing time has elapsed, the wafer boat 8 holding processed wafers is discharged from the process tube 4 and returned to its initial position. During the period in which the wafer boat 8 is loaded into and unloaded from the process tube 4 and the wafers are processed in the process tube 4, either one or both of the pods 10 may be prepared at the corresponding wafer loading ports 13 in order to receive the processed wafers.

Thereafter, the wafer transfer assembly 15 transfers a portion of the processed wafers held in the wafer boat 8 to one empty pod 10 disposed on, e.g., the first wafer loading port 13 (upper loading port) with the door 10a opened. This process corresponds to the wafer transferring process "D" at the second stage shown in FIG. 7. After completing the wafer transferring process "D" at one wafer loading port, the same process is carried out at the other wafer loading port with the door thereof being opened. This process corresponds to the process "D" at the third stage in FIG. 7.

While the wafer loading process "D" is carried out at the second wafer loading port, the pod door closing process "E", the pod changing process "A", the pod door opening process "B" and the waiting process "F" are carried out at the first wafer loading port as in the third stage of FIG. 7. The mapping process "C" is not performed because the processed wafers are transferred into an empty pod at this time.

The process "E", "A", "B" and "F" are identical to those described with respect to the wafer loading process from the pods 10 to the wafer boat 8, excepting that the pod changing process "A" represents the process transferring a pod containing the processed wafers to the pod shelf 12 from a wafer loading port and moving an empty pod from the pod shelf 12 to the wafer loading port 13.

In case all the empty pods have been transferred from the wafer loading ports 13 to the pod shelf 12 after loading all the wafers onto the boat 8, the processed wafer unloading process can be accomplished as follows. First, one empty pod is transferred from the pod shelf 12 to one of the wafer loading ports and the pod door 10a thereof is opened. These correspond to the process "A" and "B" of the first stage in FIG. 7. The timing of the processes "A" and "B" can be controlled such that the wafer transferring process "D" at the second stage can be started immediately after completing the pod door opening process "B" at the first stage. Of course, the mapping process "C" is omitted at the first stage because the pod is empty.

Thereafter at the second stage, the wafer transferring process "D" is carried out at the first wafer loading port 12, while the process "A", "B" and "F" are sequentially performed at the second wafer loading port. Then, the process at the third stage can be carried out as described above.

The processes are repeated until transferring all the processed wafers from the wafer boat 8 to the empty pods, which in turn are returned to the pod shelf 12.

As described above, since the wafer transfer assembly 15 can transfer the processed wafers from the wafer boat 8 to the pods 10 continuously without having to wait for the replacement of the pods 10 on the wafer loading ports 13, the throughput of semiconductor processing equipment 1 can be substantially increased.

The pods 10 containing the processed wafers are temporarily stored in the pod shelf 12 and then transferred to the pod stage 11 by the pod handler 14. Next, the pods on the pod stage 11 are transferred through the pod load/unload opening (not shown) to another equipment for a subsequent process and new pods containing unprocessed wafers are charged on the pod stage 11.

The processes of transferring pods between the pod shelf 12 and the pod stage 11 and charging and discharging pods into and from the semiconductor processing equipment 1 can be carried out while wafers are being processed in the process tube 4 and transferred between the wafer boat 8 and the pods 10 on the wafer loading ports 13. As a result, the total process time of the semiconductor processing equipment 1 can be reduced.

Figure 8:
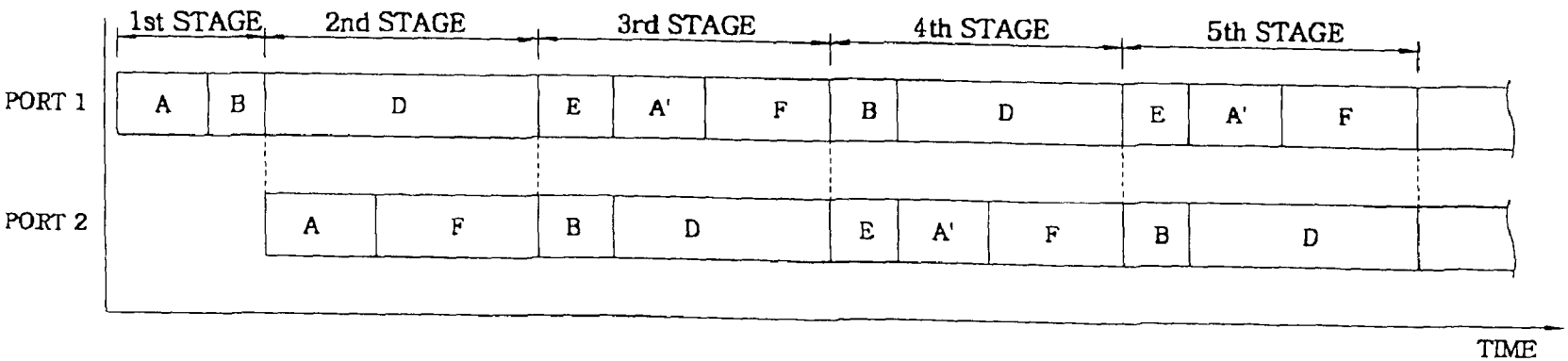
FIG. 8 illustrates another sequence for wafer loading and unloading in accordance with a second preferred embodiment of the present invention.
Figure 9:
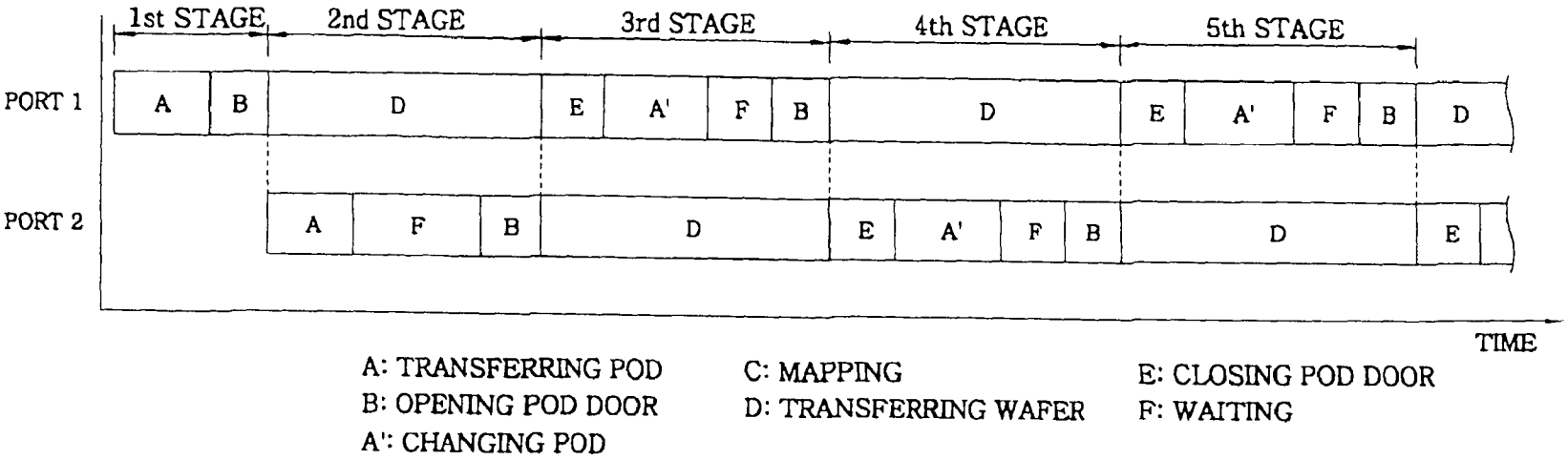
FIG. 9 illustrates still another sequence for wafer loading and unloading in accordance with a third preferred embodiment of the present invention.
Figure 10:
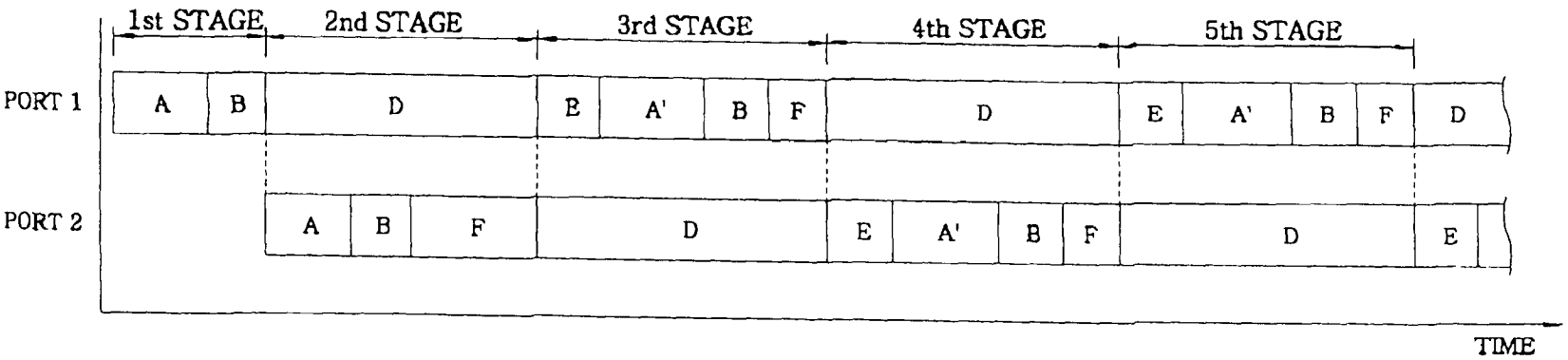
FIG. 10 illustrates still another sequence for wafer loading and unloading in accordance with a fourth preferred embodiment of the present invention.

Referring to FIGS. 8 to 10, there are illustrated wafer transferring sequences in accordance with further preferred embodiments of the present invention. In the sequences shown FIGS. 8 to 10, wafer mapping is completed at least for the pods containing wafers required for one batch process before the continuous wafer loading process begins for that batch process, e.g., by transferring the corresponding pods from the pod stage 11 to the wafer loading ports 13 in order to carry out the mapping and then moving them to pod shelf 12. Therefore, the process sequences in FIGS. 8 to 10 will be described by assuming that the wafer mapping has been completed for the pods stored on the pod shelf 12 containing wafers needed for one batch process. The processes identified as reference numerals "A" to "F" and "A" in FIGS. 8 to 10 are basically identical to those of FIG. 7.

The wafer transferring sequence in accordance with the second embodiment of the present invention will be described with reference to FIG. 8. At the first stage of the sequence for transferring unprocessed wafers to the wafer boat 8, a first pod containing unprocessed wafers is transferred from the pod shelf 12 to a first wafer loading port (process "A") and the door of the first pod is opened (process "B").

Immediately thereafter at the second stage, wafer transferring from the first pod to the wafer boat 8 (process "D") starts and, at the same time, a second pod containing the unprocessed wafers are transferred to a second wafer loading port (process "A") and waits until the wafer transferring process "D" at the first wafer loading port is completed (process "F").

At the third stage, the door of the second pod is opened (process "B") and the wafers therein are transferred to the boat 8 (process "D") and the door is restored on the empty first pod (process "E"), which is then replaced with another pod carrying unprocessed wafer (process "A"), the new pod remaining at the first wafer loading port until the wafer loading process at the second wafer loading port is completed (process "F"). The processes described in connection with the third stage are alternately carried out until all the required wafers for one batch process are transferred to the wafer boat 8.

As described above in the second embodiment of the present invention, the pod transferring process "A" and the pod changing process "A" for one wafer loading port are carried out during the wafer transferring process "D" at the other wafer loading port; and the pod door opening process "B" for one wafer loading port and the pod door closing process "E" for the other wafer loading port are simultaneously conducted.

The process sequence of the second embodiment for transferring processed wafers to empty pods is identical to that for transferring unprocessed wafers to the wafer boat 8, excepting that the pod changing process "A" in the process sequence for transferring processed wafers represents the process of transferring a pod containing the processed wafers from a wafer loading port to the pod shelf 12 and then moving an empty pod from the pod shelf 12 to that wafer loading port. The process "A" of transferring a first empty wafer to one of the wafer loading ports is controlled in such a manner that the wafer transferring from the boat to the first empty pod can be conducted immediately after completing the opening of the door of the first pod.

The sequence shown in FIG. 9 in accordance with the third embodiment of the present invention is identical to that of the second embodiment shown in FIG. 8, excepting that the pod door opening process "B" at one wafer loading port is conducted during the wafer transferring process "D" at the other wafer loading port in such a manner that the process "D" at one wafer loading port can be started upon the completion of the process "D" at the other wafer loading port. Also, the door closing process "E" at one wafer loading port and the wafer transferring process "D" at the other wafer loading port start simultaneously.

FIG. 10 illustrates a wafer transferring process in accordance with the fourth embodiment of the present invention. The process sequence shown in FIG. 10 is identical to that of the third embodiment shown in FIG. 9, excepting that the sequence of the waiting process "F" and the pod door opening process "B" is reversed at every stage.

Following advantages can be achieved in accordance with the present invention.

1) By vertically installing a pair of the pod door openers each of which is capable of independently opening and restoring the door of a pod on each wafer loading port, the wafer transferring process can be independently conducted at one wafer loading port while the other loading port is preparing for the subsequent wafer transferring process. As a result, the total process time can be considerably reduced and therefore the throughput of the semiconductor processing equipment can be increased.
2) By vertically arranging the wafer loading ports, the system efficiency can be improved without increasing the floor area or footprint of the semiconductor processing equipment.
3) The vertically arranged wafer loading ports eliminates the need for the left-right movement of the wafer carry assembly 15, thereby simplifying the structure thereof and improving the system efficiency without increasing the width of the processing equipment.
4) The independently operable mapping devices provided to the respective wafer loading ports enables the mapping process at one wafer loading port and the wafer transferring process at the other to be conducted simultaneously. As a result, the loading time needed for the subsequent wafer transferring process can be eliminated and therefore the total process time of the semiconductor processing equipment can be considerably reduced, thereby increasing the system efficiency.
5) Simplified and small sized mapping device can be obtained by employing the rotary actuating mechanism therefor, wherein the rotary actuator is mounted on the front side wall of the bulkhead and the arm fixedly coupled thereto passes through the opening in the bulkhead and the mapping device is attached at the end of the arm, enabling the mapping device to approach the wafers in a pod by the rotation of the rotary actuator.
6) Any vertical component in the motion of the pod openers would result in the height increase thereof, which in turn makes the pod shelf located above the pod openers to be disposed at a higher position and increases the height of the semiconductor processing equipment. The increased number of vertically arranged pod openers would impose the multiplicative effect in the vertical position of the pod shelf and the height increase of the processing equipment itself. The higher vertical position of the pod shelf will entails the increase of the pod-transfer time, thereby decreasing the throughput of the equipment.

In contrast, the pod openers 20 in accordance with the present invention solely operate along horizontal directions and do not contribute at all to the height increase of the equipment and the pod-transfer time. Further, the pod shelf is arranged to receive two columns of pods along the width direction of the processing equipment, whereas only one column of wafer transferring ports is provided under the pod shelf. As a result, the purely transitional lateral motion of the pod openers can be accommodated by the reserved space under the pod shelf and, therefore, the system efficiency and the throughput can be improved without increasing the pod transfer time and sacrificing the floor area of the processing equipment.

It is to be appreciated that the configuration of the semiconductor processing equipment may be varied appropriately if necessary.

For instance, the number of the wafer loading ports is not limited to two but more than two wafer loading ports can be installed vertically of if the height increase can be accommodated.

In addition, in lieu of the rotary actuator for actuating the mapping device, another mechanism using an X-Y axis robot can be employed. Moreover, the mapping device can be omitted if so required.

Furthermore, the processing equipment can be of the type capable of processing other substrates, e.g., photo masks, printed circuit boards, liquid crystal panels, compact disks and magnetic disk, than the semiconductor wafers.

The processing equipment can be of the type adapted to perform, e.g., oxide formation, diffusion process and other types of heat treating process in place of the CVD. The present invention is also applicable to other types of semiconductor processing equipments than the batch type vertical processor.

While the invention has been shown and described with respect to the preferred embodiments, it will be understood by those skilled in the art that various changes and modifications may be made without departing from the spirit and scope of the invention as defined in the following claims.

What is claimed is:

1. A substrate processing equipment comprising:

at least two pod supporting stages, each for placing thereon a pod for containing substrates therein, the pod having a door;

at least two *independently operable* pod doors opening mechanisms, each for permitting access to substrates inside the pod placed on a corresponding one of the pod supporting stages; and wherein each of the pod door opening mechanisms horizontally removes the door from the corresponding pod to thereby allow substrates disposed inside of the corresponding pod to be unloaded therefrom.

2. The substrate processing equipment of claim 1, wherein the at least two pod supporting stages are vertically arranged.

3. The substrate processing equipment of claim 1, wherein each of the pod supporting stages includes a mapping apparatus for detecting locations of the substrates in the pod placed thereon.

4. The substrate processing equipment of claim 3, wherein the mapping apparatus moves between a mapping position at which a mapping process is carried out and a standby position located away from a pod entrance of the corresponding pod to allow a substrate loading or unloading process to be carried out through the pod entrance.

5. The substrate processing equipment of claim 1, further comprising:

a substrate handling apparatus for loading substrates to a pod or unloading substrates from a pod placed on one of the pod supporting stages; and a pod transferring apparatus for placing another pod on the other pod supporting stage while the substrate handling apparatus loads substrates to the pod or unloads substrates from the pod placed on said one of the pod supporting stages.

6. The substrate processing equipment of claim 1, wherein each pod door opening mechanism moves the door of the pod between a position where the door of the pod is closed and a retreated position where the corresponding pod is completely opened.

7. A substrate processing equipment comprising:

at least [one] *two* pod [door] *doors* opening mechanism for permitting access to substrates disposed inside a pod having a door;

wherein *each of* the pod door opening mechanism moves the door of the pod horizontally from a position where the door of the pod is closed to a retreated position where the pod is completely open thereby allowing substrates to be unloaded from the pod.

8. A substrate processing equipment comprising:

a pod supporting stage for placing thereon a pod for containing substrates therein, the pod having an opening;

a mapping apparatus mounted on the pod supporting stage for detecting the locations of substrates in the pod placed on the pod supporting stage through the opening of the pod;

a substrate handling apparatus for unloading substrates from the pod placed on the pod supporting stage through the opening of the pod; and wherein the mapping apparatus pivotally moves between a mapping position at which a mapping process is carried out and a standby position located away from the opening of the pod to allow a substrates unloading process to be carried out through the opening.

9. A substrate processing method for use in a substrate processing equipment including at least two pod supporting stages, each for placing thereon a pod for containing substrates therein, the pod having a door, the method comprising the steps of:

(a) placing a first pod on one pod supporting stage;

(b) opening a door of the first pod only *independently of a door of a second pod* in substantially horizontal directions;

(c) loading or unloading substrates to or from the first pod; and (d) placing [a] *the* second pod on another pod supporting stage during the loading or unloading step (c).

*10. A substrate processing equipment comprising:*

*at least two pod supporting stages, each for placing thereon a pod for containing a plurality of substrates therein, the pod having an opening for loading and unloading the substrates and a door for opening and closing the opening of the pod wherein at least two substrate loading ports for loading and unloading the plurality of substrates out of the opening of the pod are disposed vertically; and*

*at least two pod doors opening mechanisms, each for opening and closing the opening of the pod containing closures smaller than width in the vertical direction in the door at intervals in the vertical direction and horizontal guide rails which are parallel with the opening of the pod, provided at substrate loading ports, each for permitting access to substrates inside the pod placed on a corresponding one of the pod supporting stages,*

*wherein each of the closures moves the door horizontally with the opening of the opening of the pod in horizontal same direction independently by guide rails and the each of the closure moves the door horizontally with the opening of the closing of the pod in horizontal same*

*direction independently by guide rails, such that each of the pod door opening mechanisms horizontally removes the door from the corresponding pod to thereby allow substrates disposed inside of the corresponding pod to be unloaded therefrom.*

*11. The substrate processing equipment of claim 10, further comprising:*

*an air cylinder for reciprocally operating the closure horizontally and in parallel with the opening of the pod, which are provided at each of the substrate loading ports.*

*12. The substrate processing equipment of claim 10, wherein each of the substrate loading ports includes a mapping apparatus for detecting locations of the substrates in the pod placed thereon.*

*13. The substrate processing equipment of claim 12, wherein the mapping apparatus moves between a mapping position at which a mapping process is carried out and a standby position located away from a pod entrance of the corresponding pod to allow a substrate loading or unloading process to be carried out through the pod entrance.*

*14. The substrate processing equipment of claim 10, further comprising:*

*a substrate handling apparatus for loading substrates to a pod or unloading substrates from a pod placed on one of the pod supporting stages; and*

*a pod transferring apparatus for placing another pod on the other pod supporting stage while the substrate handling apparatus loads substrates to the pod or unloads substrates from the pod places on said one of the pod supporting stages.*

*15. The substrates processing equipment of claim 10, wherein each pod door opening mechanism moves the door of the pod between a position where the door of the pod is closed and a retreated position where the corresponding pod is completely opened.*

*16. A substrate processing method for use in a substrate processing equipment including at least two pod supporting stages, each for placing thereon a pod for containing a plurality of substrates therein, the pod having an opening for loading and unloading the substrates and a door, for opening and closing the opening of the pod wherein at least two substrate loading ports for loading and unloading the plurality of substrates out of the opening of the pod are disposed vertically smaller than width in the vertical direction in the door at intervals in the vertical direction,*

*at least two pod doors opening mechanisms, each for opening and closing the opening of the pod containing closures smaller than width in the vertical direction in the door at intervals in the vertical direction and horizontal guide rails which are parallel with the opening of the pod, provided at substrate loading ports, each for permitting access to substrates inside the pod placed on a corresponding one of the pod supporting stages, the method comprising the steps of:*

*(a) placing a first pod on one pod supporting stage;*

*(b) opening a door of the first pod only in substantially the first horizontal direction and in parallel with the opening of the pod by a first closure and a first guide rail;*

*(c) loading or unloading substrates to or from the first pod; and*

*(d) placing a second pod on another pod supporting stage during the loading or unloading step (c),*

*wherein the another pod door opening mechanism moves the door of the second pod the first horizontal direction and in parallel with the opening of the pod by a second closure and a second guide rail.*

*17. A substrate processing method for use in a substrate processing equipment including at least two pod supporting stages, each for placing thereon a pod for containing substrates therein, the pod having a door, the method comprising the steps of:*

*(a) placing a first pod on one pod supporting stage;*

*(b) opening a door of the first pod only in substantially horizontal directions;*

*(c) loading or unloading substrates to or from the first pod;*

*(d) placing a second pod on another pod supporting stage during the loading or unloading step (c); and*

*(e) opening a door of the second pod from a position where the door of the second pod is closed to a retreated position where the second pod is open thereby allowing substrates to be loaded or be unloaded from the second pod during the loading or unloading step (c).*

*18. A substrate processing method for use in a substrate processing equipment including at least two pod supporting stages, each for placing thereon a pod for containing substrates therein, the pod having a door, the method comprising the steps of:*

*(a) placing a first pod on one pod supporting stage;*

*(b) opening a door of the first pod only in substantially horizontal directions;*

*(c) loading or unloading substrates to or from the first pod;*

*(d) placing a second pod on another pod supporting stage during the loading or unloading step (c);*

*(e) opening a door of the second pod during the loading or unloading step (c);*

*(f) loading or unloading substrates to or from the second pod; and*

*(g) closing the door of the first pod in substantially horizontal directions during the loading or unloading step (f).*

*19. A substrate processing method for use in a substrate processing equipment including at least two pod supporting stages, each for placing thereon a pod for containing substrates therein, the pod having a door, the method comprising the steps of:*

*(a) placing a first pod on one pod supporting stage;*

*(b) opening a door of the first pod only in substantially horizontal directions;*

*(c) loading or unloading substrates to or from the first pod;*

*(d) placing a second pod on another pod supporting stage during the loading or unloading step (c);*

*(e) opening a door of the second pod during the loading or unloading step (c); and*

*(f) detecting a position of the substrate in the second pod during the loading or unloading step (c).*

*20. The substrate processing method for use in a substrate processing equipment according to claim 17, wherein each of said at least two pod supporting stages is disposed vertically, the method further comprising: opening the door of the first pod in substantially horizontal and in parallel with the opening of the first pod in step (b); and opening the door of the second pod in substantially horizontal and in parallel with the opening of the second pod in step (e).*

* * * * *